United States Patent Office 3,175,907
Patented Mar. 30, 1965

3,175,907

STRIPPING RESISTS FROM PRINTING PLATES

Adolph Fishman, Haddonfield, N.J., assignor to Talb Industries, Inc., Philadelphia, Pa., a corporation of Pennsylvania No Drawing. Filed Feb. 7, 1963, Ser. No. 256,822
2 Claims. (Cl. 96—36)

The present invention relates to photoengraving and is particularly concerned with stripping of the insolubilized and hardened resist film from exposed and chemically etched printing plates.

Photoengraving employs a photosensitized metallic plate, generally of zinc in the case of line reproduction or copper in the case of half-tone reproduction. In the earlier processes, employing a zinc plate, for example, there was applied a layer of dichromated protein such as albumin. By exposure of the plate to light through a photographic film having contrasting dark and transparent areas, the portions of the sensitized dichromated layer exposed to the light underlying the transparent areas, undergo photochemical reaction and are insolubilized. Subsequent washing of the plate with water (or other suitable solvent) removes the unreacted areas, while the insolubilized areas remain as a reproduction of the design or indicia on the original film. By subsequent drying and accompanying hardening the insoluble portions on the plate serve as a resist to acid etching. Treatment with nitric acid dissolves the zinc from the surface of those portions of the plate not protected by the resist layer, so that the image on the original photographic film is now etched into the metal bordered by the insolubilized resist area. To provide the intaglio printing plate, the resist layer is removed by a suitable chemical treatment or mechanical abrasion or a combination of these steps.

The process as applied to half-tone reproduction is substantially similar except that copper plates are ordinarily employed and the etching is effected with iron chloride.

More recently improvements in the photoengraving process have been effected by using dichromated polyvinyl alcohol as the resist layer, for zinc as well as for copper printing plates. An important drawback to the use of such resist material has been the difficulty of removing the insolubilized and hardened polyvinyl alcohol complex from the metal plate and generally it has been found necessary to resort to mechanical abrasion for such removal, with consequent danger of obliterating sharp lines at the borders of the incised areas. Certain chemical treatments proposed, such as with caustic soda, present problems due to their corrosive action on the metal.

Among the objects of the present invention are to provide a chemical treatment for removal of the exposed and photochemically insolubilized polyvinyl alcohol resist material from etched zinc and copper printing plates. Another object is to effect such chemical removal without adverse effect on the metal of the plate.

These objectives are obtained in accordance with the present invention by treating the etched metal plate still containing the polyvinyl alcohol resist portions, with a hot aqueous solution of a peroxygen compound such as a peroxide or perborate.

The typical plate subjected to the treatment with the aqueous peroxygen compound is one of zinc or copper that is coated on one side with an acid-resistant paint or lacquer. On the opposite side there is an acid etched image bordered by a raised hardened water-insoluble coating layer of a complex formed by photochemical reaction in exposure to light of a photosensitive composition comprising a soluble dichromate (generally ammonium dichromate) and polyvinyl alcohol. Removal of this water-insoluble polyvinyl resist portion, in accordance with a preferred embodiment of the present invention, can be readily effected by treatment with a 3% (by weight) aqueous solution of hydrogen peroxide at a temperature of about 140° F. Thus, the metal plate can be dipped into the heated peroxide solution contained in a suitable receptacle (of stainless steel, glass or aluminum) and allowed to remain therein for a period of about three minutes. Slight agitation of the plate in the solution provides better surface contact and accelerates the stripping action. After removal from the treating solution the plate is rinsed in cold water and dried in any desired manner. The peroxide solution can be repeatedly reused a number of times without loss of activity, depending upon the quantity of polyvinyl film removed on each use and the amount of foreign soil contained.

The duration of the treatment for effective removal of the resist will depend upon the temperature and concentration of the peroxide treating solution. In general temperatures of from about 100 to short of the boiling point of the peroxide (as up to about 180° F.) are suitable with aqueous peroxide concentrations of from about 1 to 35% by weight. At lower temperatures and/or lower peroxide concentration longer treatment is required. At the higher temperatures there is greater loss of peroxide due to volatilization. Instead of dipping the plate into the peroxide solution, the latter may be applied by spraying, brushing or other known techniques.

While the exact nature of the complex present in the photochemically insolubilized dichromated polyvinyl alcohol is not known, nor the chemical reaction which takes place on treatment with the peroxide, it is believed that the insolubilized complex is hydrolyzed by the peroxide to water soluble products readily stripped from the metal plate.

Instead of hydrogen peroxide there may be employed other soluble peroxides such as alkali metal peroxide (e.g., $Na_2O_2$) or sodium borate perhydrate ($NaBO_2.H_2O_2$) in amounts furnishing equivalent oxygen to at least 1% $H_2O_2$ solution as heretofore indicated, and in the described temperature range. Also suitable, but not necessarily, with equal efficiency are soluble peroxygen salts such as the alkali metal perborates or persulfates and sodium borate-peroxide combinations. Since the oxygen content of these compounds is relatively low as compared to peroxide compound, these should be employed in higher concentrations to furnish an amount of releasable active oxygen equivalent to that of the described hydrogen peroxide compositions.

Effective removal of an exposed dichromated polyvinyl alcohol film on a zinc plate was effected by treatment at the boil (200° F.+) with a solution of sodium borate perhydrate (about 15.2% active oxygen) in water at a concentration of about 350 grams of the borate compound per liter of solution. At this temperature considerable oxygen was evolved and the residual solution recovered after the treatment was relatively inactive and could not be reused effectively except with prolonged extension of the treating time.

Sodium perborate ($NaBO_2.H_2O_2.3H_2O$), sometimes designated sodium perborate tetrahydrate ($NaBO_3.4H_2O$), has about 10% active oxygen and is somewhat milder in its oxidizing activity than the sodium borate perhydrate previously described. It should be employed in concentrations of no less than about 250 grams per liter and at temperatures of at least about 130° C., preferably higher.

Obviously many modifications and variations of the invention as hereinbefore set forth may be made without departing from the spirit and scope thereof, and therefore only such limitations should be imposed as are indicated in the appended claims.

What is claimed is:

1. The method of stripping resist portions from a chemically etched metallic printing plate wherein said resist portions comprise the insoluble product formed by photochemical reaction upon exposure to light of a composition comprising polyvinyl alcohol and a soluble dichromate, which method comprises treating such plate with a heated aqueous solution of hydrogen peroxide in the absence of free mineral acid.

2. The method of stripping zinc plate containing an insoluble film of resist material formed by exposure to light of a polyvinyl alcohol layer containing soluble dichromate, which comprises treating such plate at a temperature above 100° F. with a solution of hydrogen peroxide containing at least 1% by weight $H_2O_2$.

References Cited by the Examiner

UNITED STATES PATENTS 3,051,603 8/62 Michaels ---------------- 96—36

NORMAN G. TORCHIN, *Primary Examiner.*